United States Patent
Suzuki et al.

(10) Patent No.: US 6,278,598 B1
(45) Date of Patent: Aug. 21, 2001

(54) PC SWITCH CIRCUIT WITH DISCHARGE CIRCUITRY

(75) Inventors: Keiji Suzuki, Fujisawa; Satoshi Yamazaki, Sagamihara, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/299,934

(22) Filed: Apr. 26, 1999

(30) Foreign Application Priority Data

Apr. 27, 1998 (JP) .................................................. 10-117149

(51) Int. Cl.$^7$ ........................................................ H02H 9/08
(52) U.S. Cl. .......................... 361/93.9; 361/93.1; 361/84; 307/125
(58) Field of Search .................................. 361/84, 78, 79, 361/82, 18, 93.1, 93.9; 307/112–115, 125–127, 101; 323/234, 265, 282

(56) References Cited

U.S. PATENT DOCUMENTS

| | | | |
|---|---|---|---|
| 4,945,444 | * | 7/1990 | Schwertlein et al. ................ 361/101 |
| 5,079,448 | * | 1/1992 | Matsumoto ............................ 307/456 |
| 5,764,465 | * | 6/1998 | Mattes et al. .......................... 361/77 |
| 5,804,951 | * | 9/1998 | Rivet .................................... 323/223 |
| 5,811,895 | * | 9/1998 | Suzuki et al. ........................ 307/125 |
| 5,847,911 | * | 12/1998 | Reenen et al. ......................... 361/84 |
| 5,969,438 | * | 10/1999 | Odaohara .............................. 307/80 |

* cited by examiner

Primary Examiner—Michael J. Sherry
Assistant Examiner—Kim Huynh
(74) Attorney, Agent, or Firm—Bernard D Bogdon; J Bruce Schelkopf; Bracewell & Patterson, LLP

(57) ABSTRACT

Provided is a relatively simple PC switch circuit which performs a function for removing the residual voltage with a high reliability. The switch circuit includes a first switch 101 having a first terminal connected to the first power source, a second terminal connected to the load component and a control terminal to which a first control signal for controlling the first switch is supplied; a second switch 103 having a first terminal connected to the control terminal of the first switch, a second terminal connected to the second power source and a control terminal to which a second control signal for controlling the second switch is supplied; and a reverse current preventing element 107 connected between the load component and the first terminal of the second switch. A fault condition of the second switch is easily detected, and a flow of a wasteful current from the second terminal of the first switch to the second power source is prevented. This circuit is ideally suited for use in personal computer technology.

6 Claims, 5 Drawing Sheets

PC SWITCH CIRCUIT WITH DISCHARGE CIRCUITRY

RELATED PATENT FILING

This patent document has been filed concurrently with and is cross referenced to assignee's related patent specifications Ser. No. 09/299,935

DETAILED DESCRIPTION OF THE INVENTION

Field of the Invention

The present invention relates to a control switch circuit for controlling reduction of relatively small power generations. More particularly, the present invention relates to a switch circuit for a personal computer system which immediately decreases a residual voltage generated at an output circuit of the switch with a high reliability when the switch circuit is turned off.

Description of the Prior Art

A system load constituting a personal computer contains a capacitance in their power source, so that a voltage does not immediately decrease at the turn-off of the power source. For example, when a power source voltage of 5 V is turned off, the decrease of the residual voltage to 0.4 V takes about 20 seconds. It has been well known in the art that if the power source is turned on again, before that the residual voltage in the power source circuit decreases to a predetermined voltage, the system causes an operational error. Particularly, in the case that both software and user can control the turn on/off of the switch circuit, the user possibly turns the switch on immediately after the turn off of the switch circuit by the software, whereby the operational error due to the residual voltage tends to occur. To prevent such operational error, the switch circuit includes a circuit for removing the residual voltage.

FIG. 1 shows a prior switch circuit 10 including the circuit for removing the residual voltage. As an example, an input terminal of the switch circuit, to which a main power source of 5 V is connected, is connected to a drain of a power source line switching FET 11, and a source of the FET 11 is connected to an output terminal of the switch circuit. A gate of the FET 11 is connected to a gate drive power source of 12 V through a resistor 19 of 100 K Ω, and is connected to a collector of a gate drive transistor 13. A base of the transistor 13 is connected to a control signal 1 through a resistor 21, and an emitter is connected to a reference potential. One terminal of a resistor 15 of 100 Ω for limiting a discharge current is connected to the output terminal, and the other terminal of the resistor 15 is connected to a drain of a switching FET 17 of a discharge circuit. A gate of the FET 17 is connected to a control signal 2, and a source is connected to the reference potential.

In order to supply the voltage 5 V from the main power source to the output terminal, the control signal 1 is applied to the base of the transistor 13 to turn it off, whereby the FET 11 is turned on. At the same time as the application of the control signal 1, the control signal 2 is applied to the gate of the FET 17 to turn it off. In order to stop the supply of the voltage 5 V to the output terminal, the transistor 13 is turned on by the control signal 1 to turn the FET 11 off, and at the same time, the FET 17 is turned on by the control signal 2. If this control operation is performed without a time delay and the transistors 13 and 17 are adequately turned on, the residual charges are discharged to the reference potential through the resistor 15 during a short time after the turn off of the FET 11, whereby the residual voltage rapidly decreases.

However, if the FET 17 is in a fault condition and is in an open mode condition, the residual charges at the output terminal can not be discharged through the resistor 15 and the FET 17. In this case, the residual charges are discharged through only parallel impedance connected to the output terminal, and the decrease of the residual voltage takes a long time period, such as about 20 seconds, so that the probability of occurrence of the operational error due to the possible reactivation of the switch circuit during this time period becomes high. Further, if the FET 17 is in a fault condition and is in a short mode condition, the current continuously flows to the reference potential through the resistor 15 and the FET 17, so that a wasteful power is consumed. And, in this case, it is required to increase a power rating of the resistor 15 in view of a safety. Also, it is difficult to detect the fault condition of the FET 17 before the shipment of the product, which may be a personal computer system.

In general, the personal computer includes the switch circuit as shown in the FIG. 1 for each of a plurality of power sources and operational modes of the personal computer. To prevent a large current from flowing at the simultaneous turn on of these switch circuits, a delay circuit is applied between the control signal 1 and the base of the transistor 13 of each switch circuit, and a sequential operation timing is established. In this case, when the switch circuit is turned off to stop the supply of the voltage 5 V to the output terminal, the FET 17 can be turned on during the turn on condition of the FET 11, in other words, a period during which both the FETs 11 and 17 are turned on exists, so that the wasteful power has been consumed. It is especially required in the personal computer to prevent such wasteful power from being consumed.

SUMMARY OF THE INVENTION

The present invention works to solve the problem and seeks as one object of the present invention to provide a simple switch circuit which performs a function for expeditiously removing the residual voltage with a high reliability. Another object of the present invention is to provide a unique and more efficient switch circuit useful for the notebook type personal computer.

The concept of the present invention is the constitution of the switch circuit in which a first switch for controlling a supply of a main power source to a load component and a second switch for controlling a first switch is provided, and the second switch is used both as the switch for controlling the first switch and the switch in a discharge circuit, so that a fault condition of the second switch is easily detected and the operation of the discharge circuit is started after the turn off of the first switch.

The switch circuit of the present invention is connected to a first power source, a load component and a second power source. The switch circuit includes, a first switch having a first terminal connected to the first power source, a second terminal connected to the load component and a control terminal to which a first control signal for controlling the first switch is supplied; a second switch having a first terminal connected to the control terminal of the first switch, a second terminal connected to the second power source and a control terminal to which a second control signal for controlling the second switch is supplied; and a reverse current preventing element connected between the load component and the first terminal of the second switch. The first control signal supplies a drive voltage to the control terminal of the first switch. The second control signal controls the operation of the switch circuit.

It is preferable to use an FET or a bipolar transistor as the switch of the present invention. But, the concept of the present invention includes the use of any switch which has the control terminal for electrically controlling the operation of the switch. The load component may be any component constituting an electronic apparatus and including a capacitance. The switch circuit of the present invention can immediately discharge or remove the residual voltage in the load component for a short period. The reverse current preventing element prevents the first control signal from being supplied to the load component during the turn off condition of the second switch.

The switch circuit of the present invention can be used in the electronic apparatus or the personal computer which includes a power source, a power source controller and a system load. Any circuit supplying the control signal to the switch circuit can be used as the power source controller.

DESCRIPTION OF THE PREFERRED EMBODIMENT

Figure 1:
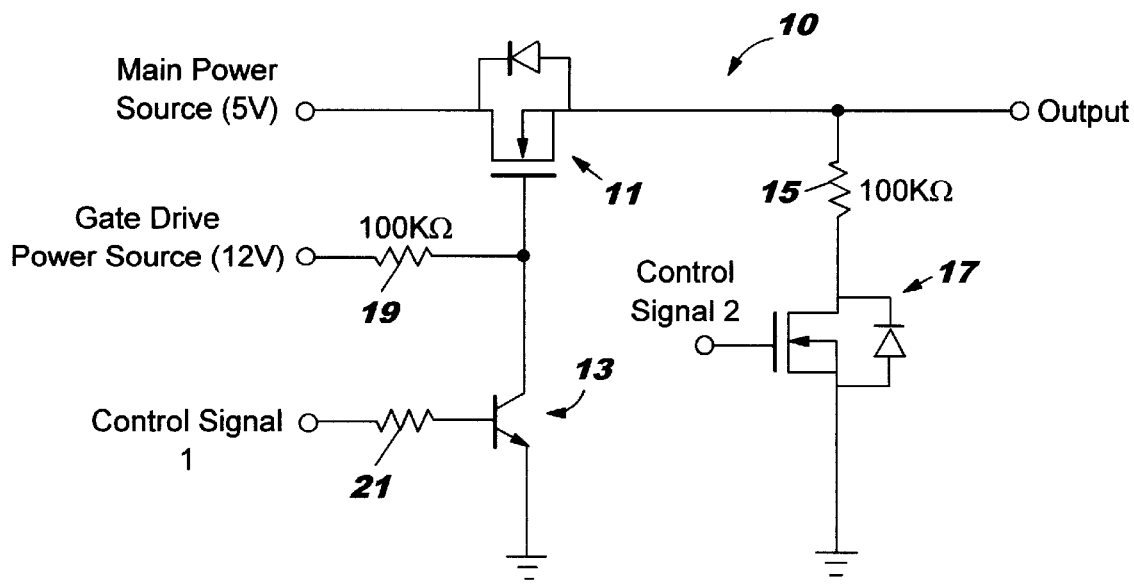
FIG. 1 shows a schematic wiring diagram of a prior switch circuit.

The following is a brief description of symbols diagramed in the drawings: power line switching FET 101, gate drive transistor 103, resistor for limiting a discharge current 105, diode for preventing a reverse current 107, resistor 109, power source controller 257, system load 311, switch circuit group 321, and switch circuits 323, 325, 327, 329, 331, 333, 335 and 337.

Figure 2:
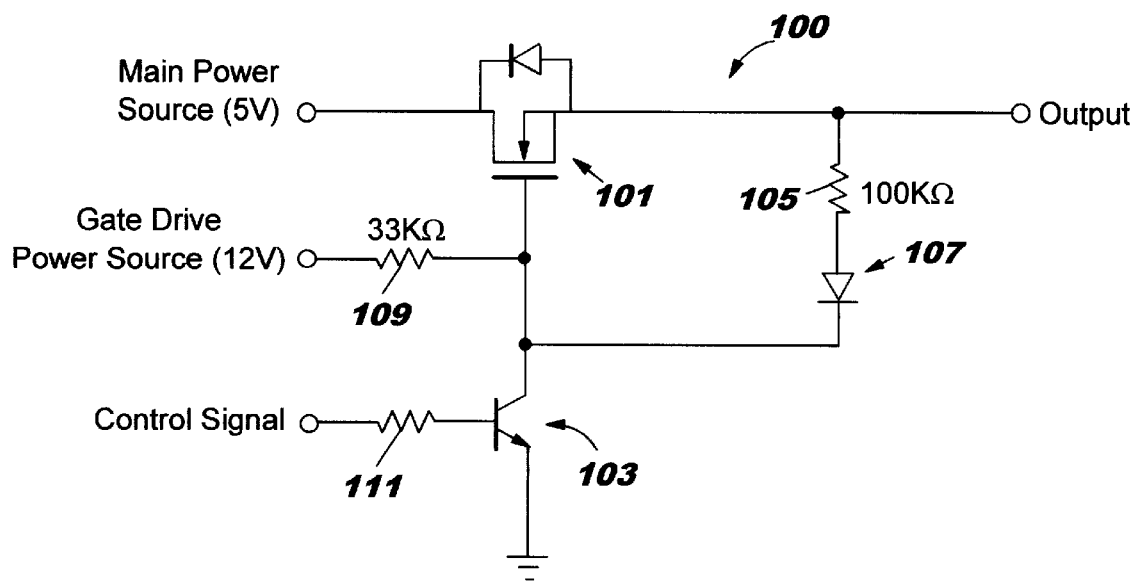
FIG. 2 shows a schematic wiring diagram of a switch circuit of the embodiment of the present invention.

FIG. 2 shows the embodiment of the switch circuit 100 of the present invention. An input terminal of the switch circuit, to which a main power source of 5 V is connected, is connected to a drain of a power source line switching FET 101, and a source of the FET 101 is connected to an output terminal of the switch circuit to which a load component is connected. When the switch circuit is used for the load component of 3.3 V, the voltage 3.3 V is applied to the input terminal. A gate of the FET 101 is connected to a gate drive power source terminal of 12 V through a resistor 109 of 33 KΩ, and is connected to a collector of a gate drive transistor 103. A base of the transistor 103 is connected to a control signal terminal through a resistor 111, and an emitter is connected to a reference potential. One terminal of a resistor 105 of 100 Ω for limiting a discharge current is connected to the output terminal, and the other terminal of the resistor 105 is connected to an anode of a diode 107 for preventing a reverse current. A cathode of the diode 107 is connected to the collector of the transistor 103. The system load of the electronic apparatus is connected to the output terminal of the switch circuit 100.

The switch circuit shown in the FIG. 2 operates in the following manner. In order to supply the voltage 5 V from the main power source to the output terminal, a control signal from the control signal terminal is applied to the base of the transistor 103 to turn kit off, whereby the gate voltage of the gate of the FET 101 is raised to the voltage 12 V of the gate power source terminal to turn the FET 101 on. At this point of time, a discharge circuit to the reference potential, which includes the resistor 105, the diode 107 and the transistor 103, is turned off, so that any current does not flow from the output terminal to the reference potential through the resistor 105 and the transistor 103.

In order to stop or prevent the supply of the voltage 5 V to the output terminal, the transistor 103 is turned-on by the control signal, so that the gate voltage of the FET 101 is decreased to turn it off. At the same time of the turn-off operation of the FET 101, the charges stored in a capacitance included in the system load connected to the output terminal are discharged to the reference potential through the discharge circuit which includes the resistor 105, the diode 107 and the turned on transistor 103. It has been experimentally measured that the time period from a time at which the FET 101 is turned off to a time at which the voltage at the output terminal decreases to 0.4 V is about 2 seconds, and this time period is sufficiently short to prevent the occurrence of the operational error due to the residual voltage at the reactivation of the switch circuit. During the turn-off condition of the transistor 103, the diode 107 prevents the current from flowing in the reverse direction from the gate drive power source terminal (12 V) to the output terminal.

When the transistor 103 is in the fault condition, this fault condition is easily detected since the FET 101 is not switched in this case. Accordingly, it is possible to prevent the wasteful power consumption or the delay of the discharge time, which occurs due to the turn on/off operation of the switch circuit in the condition that the transistor of the discharge circuit is faulted in an open mode or a short mode. Further, it is not necessary to increase the power rating of the resistor 105 for limiting the discharge current, to make provision for flowing the large current in view of the safety. Even if the delay circuit is connected between the control signal terminal and the base of the transistor 103, the wasteful power consumption does not occur since any time delay between the on/off time of the FET 101 and the formation of the discharge circuit is not generated. Further, the switch circuit of the present invention does not require the discrete FET (17) in the discharge circuit in the prior switch circuit, so that the number of parts can be decreased in the switch circuit of the present invention.

Figure 3:
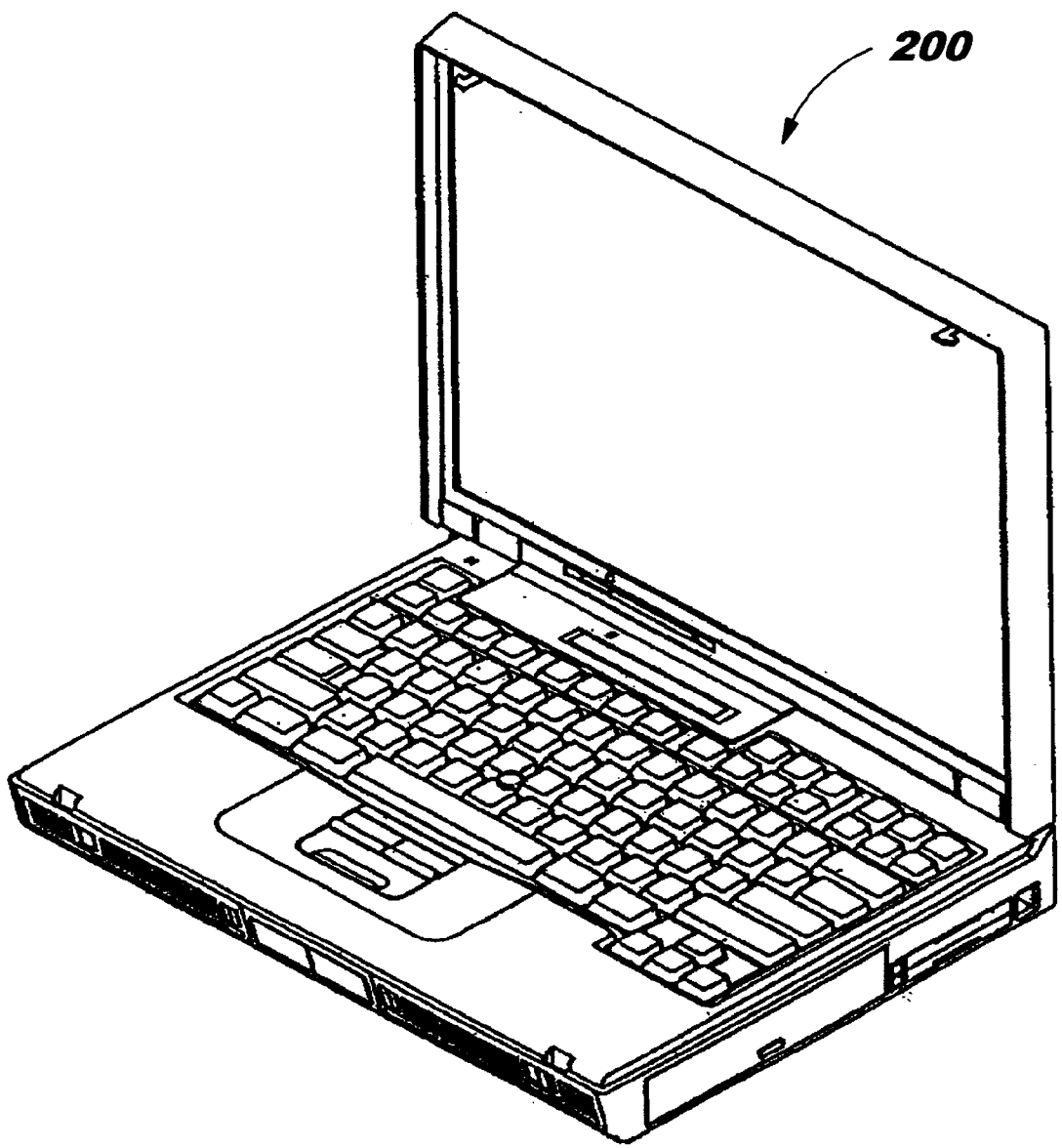
FIG. 3 shows a schematic external shape of the personal computer in the embodiment of the present invention.
Figure 4:
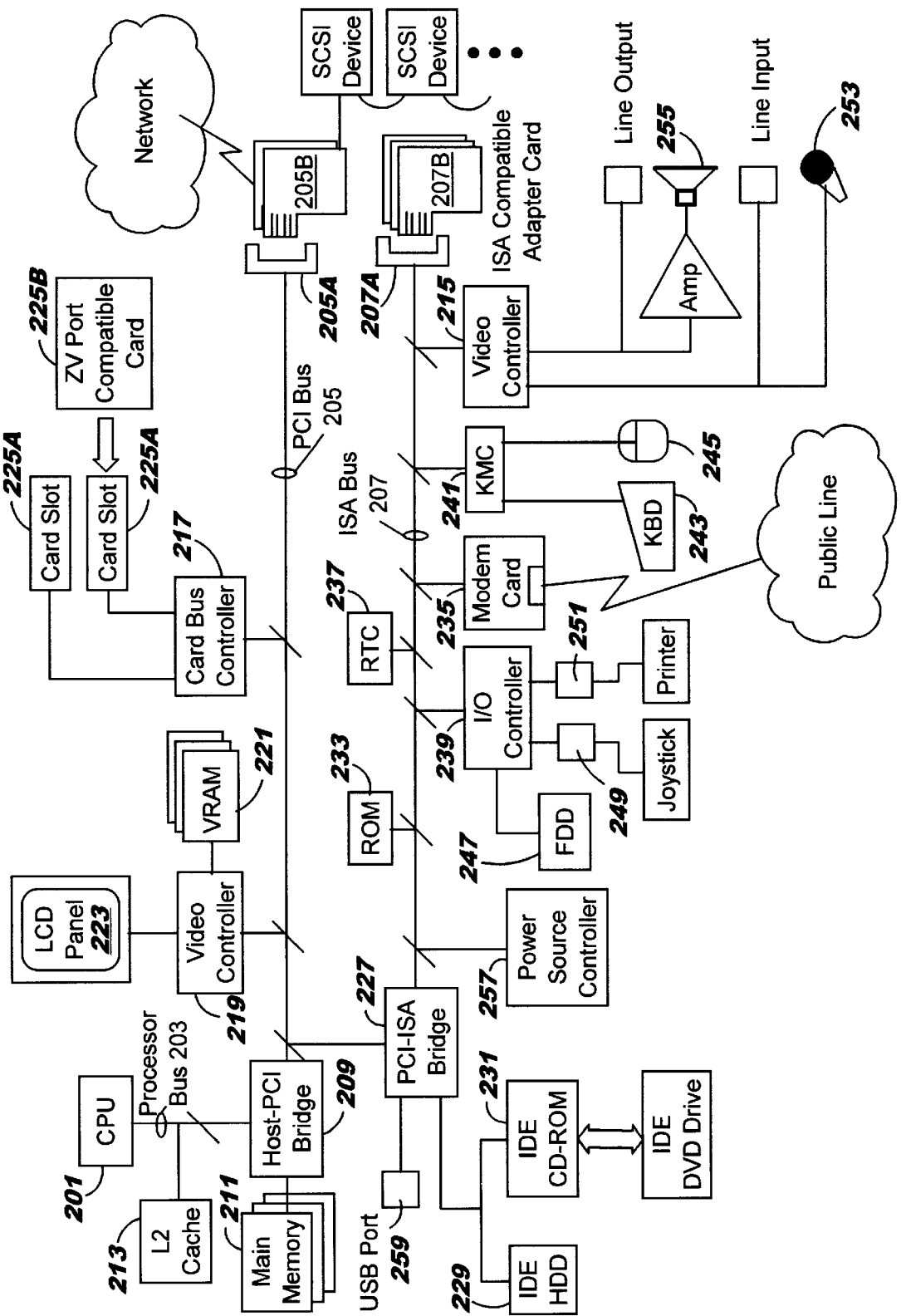
FIG. 4 schematically shows a hardware configuration of the personal computer in the embodiment of the present invention.

FIG. 3 shows an external shape of the typical notebook type personal computer (PC) 200 for implementing the present invention. But, the present invention can be applicable to a desktop type computer or the electronic apparatus in addition to the notebook type computer. FIG. 4 schematically shows a hardware configuration of the PC 200 shown in the FIG. 3. A CPU 201 acting as a main controller executes a variety of programs under the control of an operating system (OS).

The CPU 201 interconnects with each hardware block through a hierarchical bus structure of three levels, which comprises a processor bus 203, a PCI (Peripheral Component Interconnect) bus 205 as a local bus and an ISA (Industry Standard Architecture) bus 207 as a system bus.

The processor bus 203 and the PCI bus 205 are interconnected by a bridge circuit (host-PCI bridge) 209. This bridge circuit 209 in the embodiment comprises a memory controller for controlling access operations to a main memory 211, a data buffer for absorbing a difference in data transfer speeds between both the buses 203 and 206.

The main memory 211 is a writeable memory used as read-in areas of executed programs of the CPU 201 or working areas of the processed data of the executed programs. The executed programs include an OS (operating system) such as "Windows95" from Microsoft Corporation, each device driver for operating peripheral equipment as hardware and a variety of application programs.

A level 2 (L2)-cache 213 is a high speed memory for absorbing an access time of the CPU 201 to the main memory 211 and is used for temporarily storing limited codes and data to be frequently accessed by the CPU 201.

The PCI bus 205 is a type of bus that enables to transfer data at a relatively high rate, and is used for connecting relatively fast PCI devices such as a video controller 215 and a card bus controller 217.

The video controller 219 is a dedicated controller for actually processing drawing instructions from the CPU 201. In operation, it temporarily stores the processed drawing information into a screen buffer (VRAM) 221, reads the drawing information from the VRAM 221 and provides the same as a video output to a liquid crystal display (LCD) 223.

The card bus controller 217 is a dedicated controller for directly coupling the bus signals on the PCI bus 205 to an interface connector (card bus) of a PC card slot 225A. Insertable into this PC card slot 225A is a PC card 225B, which conforms to the industry standard (e.g., "PC Card Standard 95") defined by PCMCIA (Personal Computer Memory Card International Association)/JEIDA (Japan Electronic Industry Development Association). As the types of PC card 225B, there are a LAN card for connection to a network, an integrated HDD card as an external storage device, a SCSI (Small Computer System Interface) card for connection to an external SCSI device, and the like.

The PCI bus 205 and the ISA bus 207 are interconnected by a bridge circuit (PCI-ISA bridge) 227. This bridge circuit 227 is constructed to contain a DMA controller, a programmable interrupt controller (PIC) and a programmable interval timer (PIT). The DMA controller is a dedicated controller for executing a data transfer between a peripheral device (e.g., FDD) and the main memory 211 without an intervention of CPU 201. The programmable interrupt controller (PIC) is a dedicated controller that is responsive to an interruption request (IRQ) from the peripheral device for causing a predetermined processing program (interrupt handler) to be executed. The programmable interval timer (PIT) is an apparatus for generating timer signals (normally, in the form of square waves) at predetermined frequencies, which are programmable.

Also, the bridge circuit 227 is provided with an IDE interface for connecting the external storage devices, which conform to the IDE (Integrated Drive Electronics). To this IDE interface, an IDE hard disk drive (HDD) 229 and an IDE CD-ROM drive 231 may be connected by means of ATAPI (AT Attachment Packet Interface). In place of the IDE CD-ROM drive 231, another type of an IDE device such as a DVD (Digital Video Disk or Digital Versatile Disk) drive may be connected.

Further, the bridge circuit 227 in the embodiment has a USB route controller for connecting a USB (Universal Serial Bus) as a general purpose bus, as well as a USB port 259.

The USB supports the "Hot Plugging" function for allowing a new peripheral device (USB device) to be attached/detached while its power is turned on, in addition to the "Plug and Play" (PNP) function for automatically recognizing a newly connected peripheral device and for performing re-setup of the system configuration. To a single USB port, a maximum of sixty three USB devices can be connected in a daisy chain fashion. Examples of the USB devices are a keyboard, a mouse, a joystick, a scanner, a printer, a modem, a display monitor, a tablet, and the like.

The ISA bus 207 has a slower data transfer rate than the PCI bus 205 and, thus, it is used for connecting relatively slower peripheral devices such as a ROM 233, a modem card 235, a real time clock (RTC) 237, an I/O controller 239, a keyboard/mouse controller (KMC) 241 and an audio controller 215.

The ROM 233 is a non-volatile memory, which permanently stores code groups (BIOS: Basic Input/Output System) for controlling the I/O operations of the respective hardware components such as a keyboard 243 and a floppy disk drive (FDD) 247, in addition to a POST (Power On Self Test) program or the like.

The modem card 235 is a device for transmitting computer data in a digital form via an analog telephone line (PSTN: Public Switched Telephone Network). The modem card 235 includes a signal processing circuit (modem chip) for modulating the transmission data and for demodulating the received data, as well as other circuit components such as a data access arrangement (DAA) circuit for connecting the modem to a public line in accordance with the line switching standards for each country.

The RTC (Real Time Clock) 237 is a device for measuring the current time-of-day. In general, the RTC 237 is mounted on a single chip with a CMOS memory (not shown). Typically, this CMOS memory is used for temporarily storing critical information to security/safety of the computer 200 such as system configuration information (setup value of BIOS) and a power on password.

The I/O controller 239 is a peripheral controller for controlling operations of the FDD 247, the I/O operations of serial data (SIO) via a serial port 249, and the I/O operations of parallel data (PIO) via a parallel port 251. A joystick may be connected to the serial port and a printer may be connected to the parallel port.

The keyboard/mouse controller (KMC) 241 is a peripheral controller for capturing the input scan codes from the keyboard 243, or the input coordinate values from the pointing device 245 (the mouse or the track point) as the computer data.

The Audio controller 215 is a dedicated controller for performing the I/O processing of audio signals, and it includes a CODEC (COder-DECoder or an AD/DA converter having a mixing function) for recording/reproducing the audio signals in a digital form. The audio signals may be received as voice signals from a microphone 253, or as a line input from an external audio equipment (not shown). Conversely, the generated audio signals may be provided as a line output to an external audio equipment (not shown), or reproduced by a speaker 255 after amplified by an audio amplifier.

At one end of each of the buses 205 and 207, at least one PCI bus slot 205A and at least one ISA bus slot 207A may be provided, respectively. These bus slots 205A and 207A are exposed at a portion of a wall of the computer 200. A PCI compatible adapter card 205B and an ISA compatible adapter card 207B may be mounted in the bus slots 205A and 207A, respectively.

The typical general purpose personal computers will sufficiently function as the computer system 200 shown in FIG. 4. It is apparent that additional electronic circuits or the like other than those shown in FIG. 4 are required to construct the computer system 200. However, these components are not described in the present specification, since they are well known in the art and yet they do not pertain to the gist of this invention. Also, it should be understood that for brevity of the drawings, only a portion of the connections between the illustrated hardware blocks is shown.

A power source controller 257 for controlling the switch circuits of the present invention is a peripheral controller which mainly controls the supply of the power to each of the portions in the system, and includes the RAM, the ROM, the timer, etc. in addition to the processor, and its function is programmable.

Figure 5:
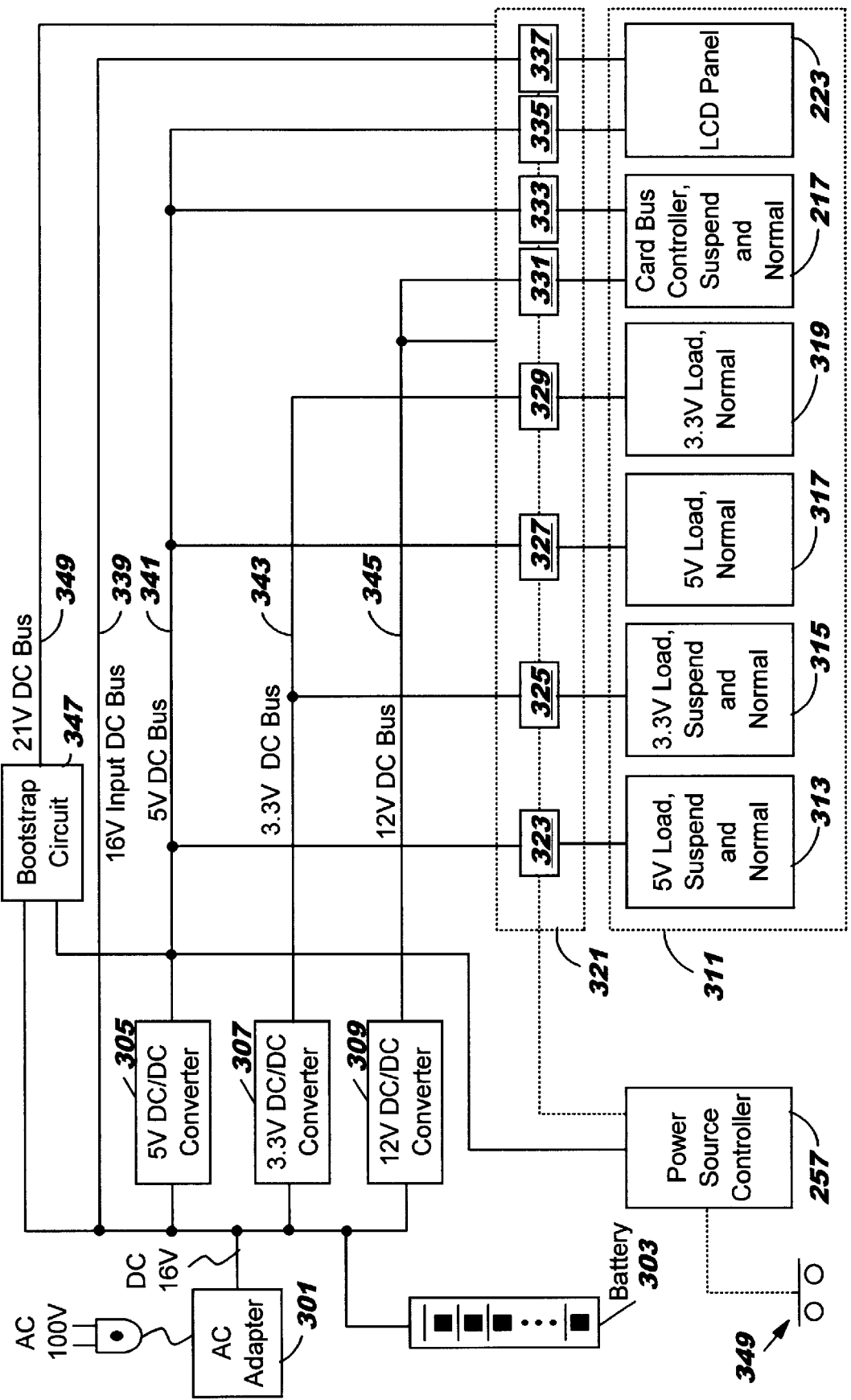
FIG. 5 schematically shows a power supply system for the personal computer in the embodiment of the present invention.

FIG. 5 schematically shows a power supply system for each of the components of the PC 200. The same component as that shown in the FIG. 4 is assigned with the same reference number. As shown in the FIG. 5, the main power source of the PC 200 is a commercial power source or a battery 303 mounted within the PC 200. The output terminal of an AC adapter 301 which converts the AC 100 V to DC 16 V and an output terminal of the battery 303 are connected in parallel to DC/DC converters 305,307 and 309. Five kinds of voltages 21 V, 16 V, 12 V, 5 V and 3.3 V are used in the PC 200, and these voltages are supplied to a system load 311 through a 21 V DC bus 349, a 16 V input DC bus 339, a 12 V DC bus 345, a 5 V DC bus 341 and a 3.3 V DC bus 343. A bootstrap circuit 347 generates an output voltage of 21 V by adding the input voltage 16 V and the input voltage 5 V, and supplies the gate drive power source of the switch circuits used for the 12 V load and the 16 V load.

The system load 311 represents a group of the loads used within the PC 200, and is divided into six blocks each of which uses a different power source and control mode. The load in each block has a capacitance, and the voltage does not immediately decrease at the turn off of the power source. A 5 V load 313 and a 3.3 V load 315 are a group of a 5 V apparatus and a 3.3 V apparatus which operate in both suspend mode and normal mode. A 5 V load 317 and a 3.3 V load 319 are a group of a 5 V apparatus and a 3.3 V apparatus which operate in the normal mode. The suspend mode means a condition in which the operation of the system except the selected apparatus is stopped after saving the data required for restarting the task being processed, to save the power and to immediately restart the task. The 5 V load 313 includes the audio controller 215, the serial port 249, the KMC 241 and the VRAM 221. The 3.3 V load 315 includes the main memory 211 and the video controller 219. The 5 V load 317 includes the HDD 229, the CD-ROM 231, the FDD 247, the modem card 235, the audio controller 215, the parallel port 251, the ROM 233 and the I/O controller 239. The 3.3 V load 319 includes the CPU 201.

The card bus controller 217 operates in both the suspend mode and normal mode, and uses two kinds of power sources 5 V and 12 V. The LCD panel 223 uses the two kinds of power sources, i.e. the 16 V to an inverter for driving a cold cathode ray tube and the 5 V to the system, and operates in a mode which differs from the normal mode and the suspend mode.

The turn on/off of the power source to each block of the system load 311 is controlled by a group of circuits 321 which is disposed between the power supply buses and the system load 311, and includes the switch circuits 323, 325, 327, 329, 331, 333, 335 and 337 of the embodiment of the present invention. The switch circuits are implemented by a semiconductor chip technology wherein one semiconductor chip may contain one or two switch circuit(s), but one semiconductor chip may contain more switch circuits.

The 12 V power source as the gate drive power source is supplied from the 12 V DC bus to the switch circuits 323, 327, 333 and 335 for the 5 V loads 313, 317, 217 and 223, and the switch circuits 325 and 329 for the 3.3 V loads 315 and 319. The 21 V power source as the gate drive power source is supplied from the output of the bootstrap circuit 347 to the switch circuits 331 and 337 for the 12 V load 217 and 16 V load 223 through the 21 V DC bus 349. The 3.3 V, the 5 V, the 12 V and the 16 V are supplied from each bus 343, 341, 345 and 339 to the input terminals of the switch circuits in depending upon the voltage required for the block of the system load. The power source controller 257 of the embodiment monitors the remaining power in the battery 303, the on/off state of the LCD panel 223 to the control circuit in the PC 200, a fixed time period during which the operation is not made, etc., and supplies the control signals to the switch circuits to control the on/off of the supply of the power source to the apparatuses in the system in accordance with the result of the monitor.

The turn on operation of each of the load blocks included in the system load 311 is so controlled that the switch circuits 323 through 337 are sequentially turned on by using the delay circuits or the control of the software to prevent the large current from flowing due to the simultaneous turn on of all the system loads. A power on switch 349 operated by the user is connected to the power source controller 257. When the power on switch 349 is turned on, a signal is supplied to the power source controller 257, whereby the control signal indicating the turn on of the switch circuits is supplied to the switch circuits to turn it on.

In the embodiment of the switch circuit shown in the FIG. 2 of the present invention, when the power source controller 257 supplies the control signal for turning the switch circuit group 321 off, the discharge circuit immediately removes or discharges the residual voltage in the system load 311 during the short period, so that no operational error occurs even if the power on switch 349 is immediately turned on. Further, even if the delay circuit is connected to the base of the transistor 103 shown in the FIG. 2, the switch circuit of the present invention does not cause the problem, i.e. the wasteful power consumption, in the prior switch circuit shown in the FIG. 1 due to the turn on of the FET 17 before the turn off of the FET 11, since the transistor 103 of the switch circuit of the present invention operates both as the switch for controlling the FET 101 and the switch of the discharge circuit, as described before.

Figure 6:
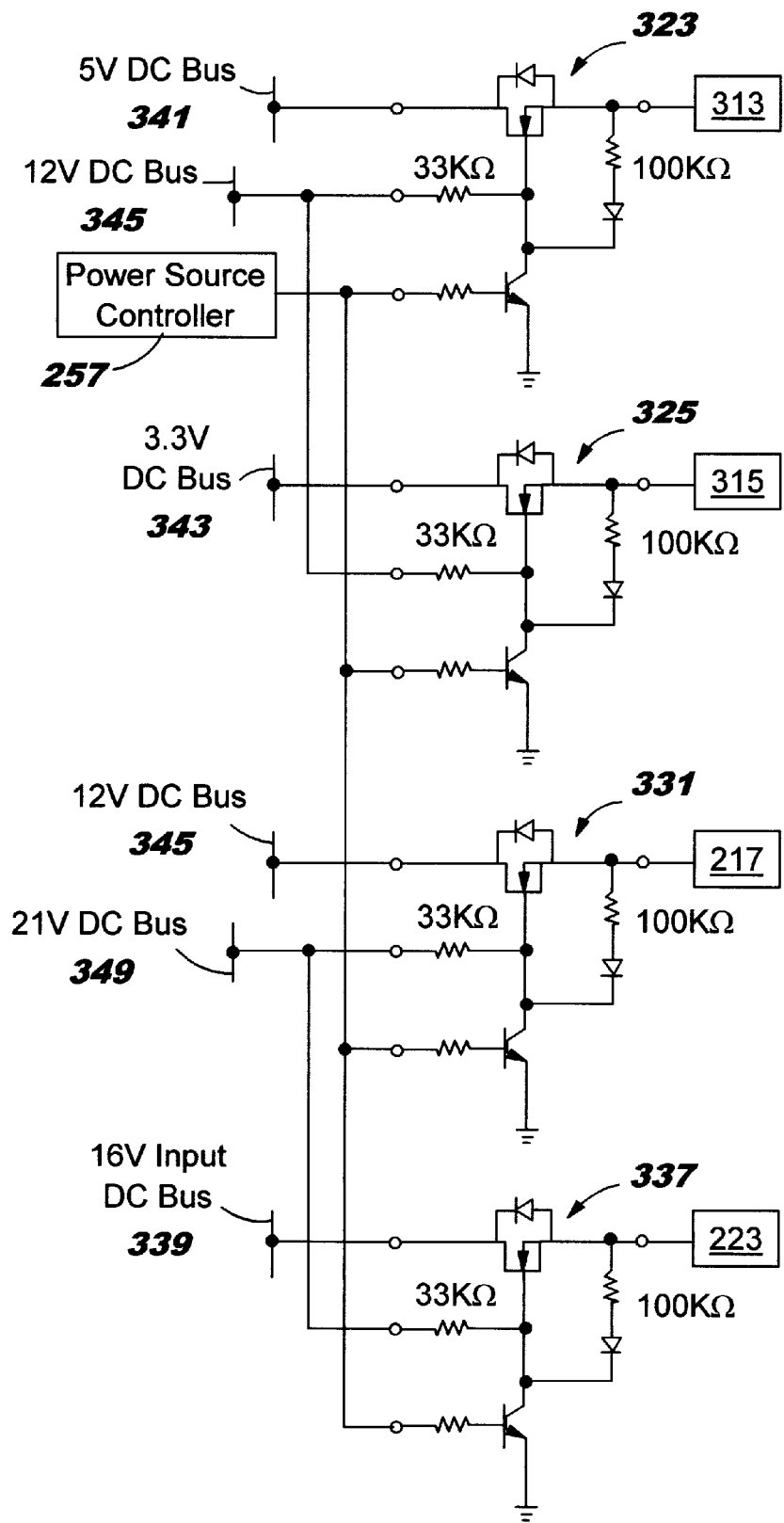
FIG. 6 shows a schematic wiring diagram of a portion of the power supply system shown in the FIG. 5.

FIG. 6 shows a schematic wiring diagram of a portion of the power supply system shown in the FIG. 5. Although the FIG. 6 shows only the switch circuits used for the typical system loads shown in the FIG. 5, it will be understood by those having skill in the art that the same wiring scheme as that shown in the FIG. 6 is applied to the remaining switch circuits.

Some positive effects of the present invention are that it provides the simple switch circuit which performs a function for removing the residual voltage with a high reliability. Further, the present invention provides the switch circuit particularly useful for the personal computer.

What is claimed is:

1. A personal computer electronic apparatus including a first power source, a power source controller, a switch circuit connected to said first power source and said power source controller, and a system load connected to said switch circuit, wherein said switch circuit is connected to the first power source, a load component and a second power source, comprising:

a first switch having a first terminal connected to said first power source, a second terminal connected to said load component and a control terminal to which a first control signal for controlling said first switch is supplied;

a second switch having a first terminal connected to said control terminal of said first switch, a second terminal connected to said second power source and a control terminal to which a second control signal for controlling said second switch is supplied; and a reverse current preventing element including a resistor and a diode connected between said load component and said first terminal of said second switch.

2. The apparatus according to claim 1, wherein the switch circuit further comprising said reverse current preventing element including a first terminal of said resistor being directly connected to said load, a second terminal of said resistor being directly connected to a first terminal of said diode, and a second terminal of said diode being directly connected to said first terminal of said second switch.

3. A personal computer electronic apparatus including a first power source, a power source controller, a switch circuit connected to said first power source and said power source controller, and a system load connected to said switch circuit, wherein said switch circuit connected to the first power source, a load component and a second power source, comprising:

a first switch having a first terminal connected to said first power source, a second terminal connected to said load component and a control terminal to which a fist control signal for controlling said first switch is supplied;

a second switch having a first terminal connected to said control terminal of said first switch, a second terminal connected to said second power source and a control terminal to which a second control signal for controlling said second switch is supplied;

a reverse current preventing element including a resistor and a diode connected between said load component and said first terminal of said second switch and, wherein each of said first switch and said second switch is a transistor.

4. The apparatus according to claim 2, wherein the switch circuit further comprising said reverse current preventing element including a first terminal of said resistor being directly connected to said load, a second terminal of said resistor being directly connected to a first terminal of said diode, and a second terminal of said diode being directly connected to said first terminal of said second switch.

5. A personal computer electronic apparatus including a first power source, a power source controller, a switch circuit connected to said first power source and said power source controller, and a system load connected to said switch circuit, wherein said switch circuit is connected to the first power source, a load component and a second power source, comprising:

a first switch having a first terminal connected to said first power source, a second terminal connected to said load component and a control terminal to which a first control signal for controlling said first switch is supplied;

a second switch having a first terminal connected to said control terminal of said first switch, a second terminal connected to said second power source and a control terminal to which a second control signal for controlling said second switch is supplied;

a reverse current preventing element including a resistor and a diode connected between said load component and said first terminal of said second switch; and said resistor connected between said load component and said first terminal for limiting a discharge current connected between said load component and said diode.

6. The apparatus according to claim 5, wherein the switch circuit further comprising said reverse current preventing element including a first terminal of said resistor being directly connected to said load, a second terminal of said resistor being directly connected to a first terminal of said diode, and a second terminal of said diode being directly connected to said first terminal of said second switch.

* * * * *